United States Patent
Cheng et al.

(10) Patent No.: US 7,888,722 B2
(45) Date of Patent: Feb. 15, 2011

(54) TRENCH CAPACITORS AND MEMORY CELLS USING TRENCH CAPACITORS

(75) Inventors: Kangguo Cheng, Beacon, NY (US); Xi Li, Somers, NY (US)

(73) Assignee: International Business Machines Corporation, Armonk, NY (US)

( * ) Notice: Subject to any disclaimer, the term of this patent is extended or adjusted under 35 U.S.C. 154(b) by 217 days.

(21) Appl. No.: 12/138,536

(22) Filed: Jun. 13, 2008

(65) Prior Publication Data

US 2008/0246068 A1    Oct. 9, 2008

Related U.S. Application Data

(62) Division of application No. 11/427,065, filed on Jun. 28, 2006, now Pat. No. 7,709,320.

(51) Int. Cl.
*H01L 21/8242* (2006.01)
*H01L 27/108* (2006.01)

(52) U.S. Cl. ............ 257/301; 257/68; 257/71; 257/244; 257/298; 257/520; 257/E27.084; 257/E27.092; 257/E27.093; 257/E29.346; 438/243

(58) Field of Classification Search .......... 257/68, 257/71, 118, 244, 328–333, 466, 513, 594, 257/906, E21.546–E21.55, E21.646, E27.084, 257/E29.346, E21.396, 296, 298, 300–303, 257/520, 535, 908; 438/242–243, 268–274, 438/221–224, 296, 359–361, 386, 424–438
See application file for complete search history.

(56) References Cited

U.S. PATENT DOCUMENTS

| | | | |
|---|---|---|---|
| 5,604,159 A | 2/1997 | Cooper et al. | |
| 5,641,694 A | 6/1997 | Kenney | |
| 5,744,386 A | 4/1998 | Kenney | |
| 5,891,807 A | 4/1999 | Muller et al. | |
| 5,905,279 A | 5/1999 | Nitayama et al. | |
| 5,914,523 A | 6/1999 | Bashir et al. | |
| 5,930,107 A | 7/1999 | Rajeevakumar | |
| 6,018,174 A * | 1/2000 | Schrems et al. | 257/296 |
| 6,103,585 A * | 8/2000 | Michaelis et al. | 438/386 |
| 6,127,278 A | 10/2000 | Wang et al. | |
| 6,207,494 B1 * | 3/2001 | Graimann et al. | 438/248 |
| 6,232,171 B1 * | 5/2001 | Mei | 438/246 |
| 6,274,457 B1 * | 8/2001 | Sakai et al. | 438/424 |
| 6,281,068 B1 * | 8/2001 | Coronel et al. | 438/243 |
| 6,319,788 B1 * | 11/2001 | Gruening et al. | 438/386 |
| 6,342,450 B1 | 1/2002 | Lattard | |

(Continued)

OTHER PUBLICATIONS

Notice of Allowance (Mail Date Dec. 16, 2009) for U.S. Appl. No. 11/427,065, filed Jun. 28, 2006; Confirmation No. 1908.

*Primary Examiner*—Matthew C Landau
*Assistant Examiner*—Maliheh Malek
(74) *Attorney, Agent, or Firm*—Schmeiser, Olsen & Watts; Ian D. MacKinnon

(57) ABSTRACT

A trench structure and a memory cell using the trench structure. The trench structure includes: a substrate; a trench having contiguous upper, middle and lower regions, the trench extending from a top surface of said substrate into said substrate; the upper region of the trench having a vertical sidewall profile; and the middle region of the trench having a tapered sidewall profile.

20 Claims, 10 Drawing Sheets

U.S. PATENT DOCUMENTS

| | | |
|---|---|---|
| 6,365,485 B1 * | 4/2002 | Shiao et al. ............... 438/392 |
| 6,380,095 B1 * | 4/2002 | Liu et al. ................. 438/719 |
| 6,440,792 B1 * | 8/2002 | Shiao et al. ............... 438/243 |
| 6,544,838 B2 * | 4/2003 | Ranade et al. ............. 438/244 |
| 6,674,113 B2 | 1/2004 | Goldbach et al. |
| 6,713,341 B2 | 3/2004 | Chen et al. |
| 6,716,696 B2 | 4/2004 | Chen et al. |
| 6,756,626 B2 | 6/2004 | Lutzen |
| 6,762,447 B1 | 7/2004 | Mandelman et al. |
| 6,809,005 B2 * | 10/2004 | Ranade et al. ............. 438/426 |
| 6,989,561 B2 | 1/2006 | Lin et al. |
| 7,038,289 B2 * | 5/2006 | Marty et al. ............... 257/501 |
| 7,109,543 B2 | 9/2006 | Park |
| 7,132,324 B2 | 11/2006 | Cheng et al. |
| 7,153,738 B2 | 12/2006 | Cheng et al. |
| 7,485,525 B2 | 2/2009 | Cheng et al. |
| 7,488,642 B2 | 2/2009 | Cheng et al. |
| 7,553,767 B2 | 6/2009 | Cho et al. |
| 2001/0023134 A1 | 9/2001 | Akatsu et al. |
| 2001/0044180 A1 | 11/2001 | Schrems |
| 2002/0036310 A1 * | 3/2002 | Lutzen ..................... 257/301 |
| 2002/0132422 A1 | 9/2002 | Ranade et al. |
| 2003/0020112 A1 | 1/2003 | Tews et al. |
| 2003/0045052 A1 | 3/2003 | Birner et al. |
| 2003/0073271 A1 | 4/2003 | Birner et al. |
| 2003/0143809 A1 | 7/2003 | Hummler |
| 2003/0155609 A1 | 8/2003 | Mandelman et al. |
| 2003/0173618 A1 | 9/2003 | Zundel et al. |
| 2004/0180510 A1 | 9/2004 | Ranade et al. |
| 2004/0259368 A1 * | 12/2004 | Lai ........................ 438/704 |
| 2005/0093080 A1 | 5/2005 | Kitamura et al. |
| 2005/0212027 A1 * | 9/2005 | Adam et al. ............... 257/302 |
| 2005/0285175 A1 | 12/2005 | Cheng et al. |
| 2006/0049455 A1 | 3/2006 | Jang et al. |
| 2006/0145247 A1 | 7/2006 | Zundel et al. |
| 2006/0231877 A1 * | 10/2006 | Takenaka et al. ........... 257/296 |
| 2006/0255390 A1 * | 11/2006 | Matsumoto et al. .......... 257/301 |
| 2007/0059897 A1 | 3/2007 | Tilke et al. |
| 2007/0077702 A1 | 4/2007 | Cheng et al. |
| 2007/0145416 A1 * | 6/2007 | Ohta et al. ................ 257/213 |
| 2007/0148893 A1 | 6/2007 | Josiek et al. |
| 2007/0164397 A1 | 7/2007 | Cheng et al. |
| 2007/0189057 A1 | 8/2007 | Cheng et al. |
| 2007/0205489 A1 * | 9/2007 | Tilke et al. ................ 257/618 |
| 2007/0224757 A1 | 9/2007 | Cheng et al. |
| 2007/0296012 A1 | 12/2007 | Cheng et al. |
| 2008/0035978 A1 | 2/2008 | Fleming, Jr. et al. |
| 2008/0064178 A1 | 3/2008 | Ho et al. |
| 2008/0076230 A1 | 3/2008 | Cheng et al. |
| 2008/0102569 A1 | 5/2008 | Cheng et al. |
| 2008/0132029 A1 | 6/2008 | Cheng et al. |
| 2008/0166846 A1 | 7/2008 | Marchant et al. |
| 2008/0248625 A1 | 10/2008 | Cheng et al. |
| 2008/0258268 A1 | 10/2008 | Cheng |
| 2008/0290448 A1 * | 11/2008 | Tilke et al. ................ 257/513 |
| 2009/0176339 A1 * | 7/2009 | Cheng et al. ............... 438/242 |

* cited by examiner

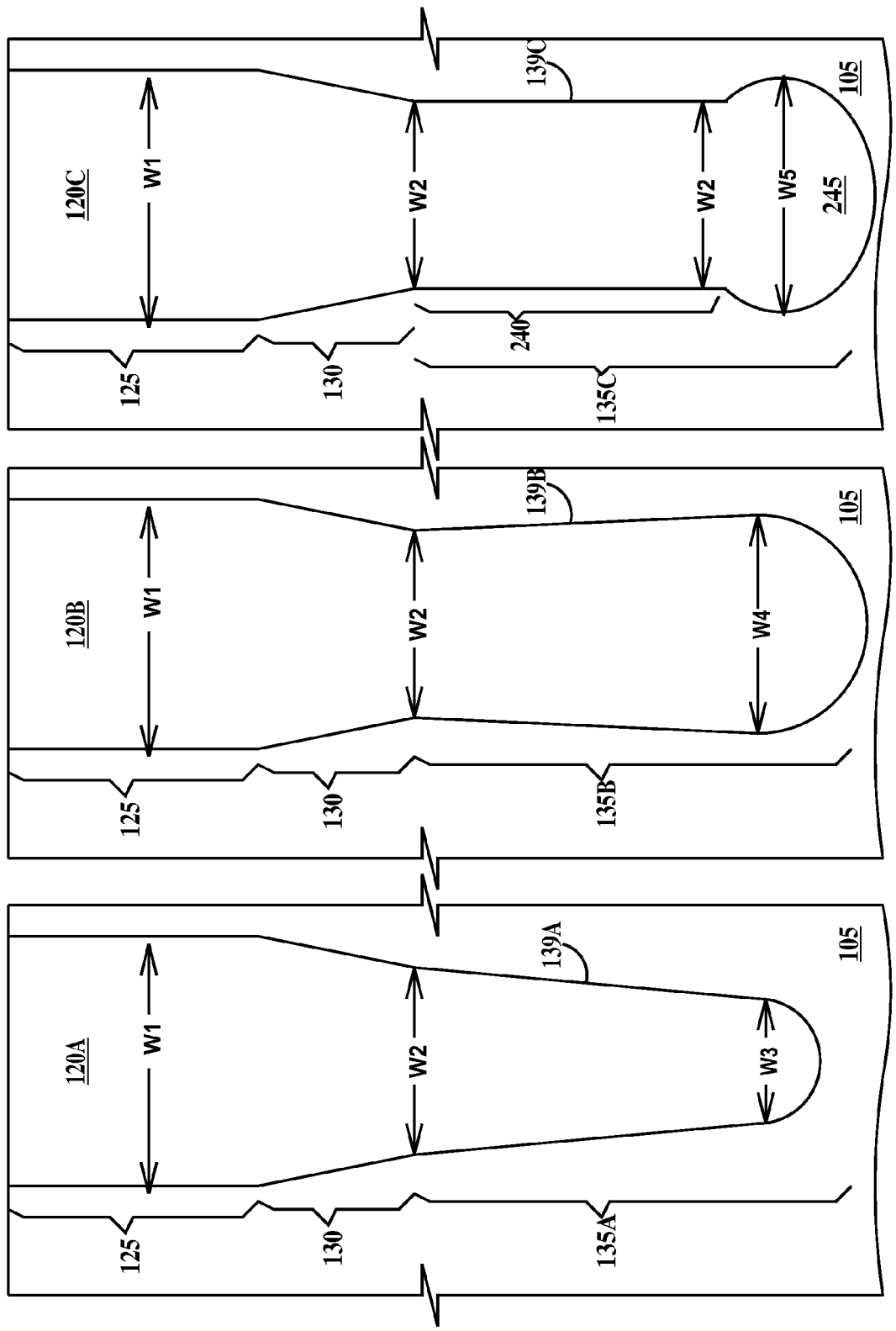

TRENCH CAPACITORS AND MEMORY CELLS USING TRENCH CAPACITORS

This application is a division of U.S. patent application Ser. No. 11/427,065 filed on Jun. 28, 2006.

FIELD OF THE INVENTION

The present invention relates to the field of semiconductor devices; more specifically, it relates to semiconductor trench capacitors and memory cells using the trench capacitors and method of fabricating the semiconductor trench capacitors and memory cells using the trench capacitors.

BACKGROUND OF THE INVENTION

A predominate use of trench capacitors is as the storage nodes of dynamic random access memory (DRAM) cells, though there are many other uses. As the density of DRAM increases and the photolithographic groundrules and resultant physical dimensions of the trench capacitors decrease, it has become increasingly difficult to fabricate the resultant narrow trenches. Additionally, narrow trenches have lower capacitance and higher resistance than wide trenches leading to lower reliability. Therefore, there is a need for trench capacitor structures and a method of fabricating trench capacitors that is scalable to ever decreasing trench widths and that overcomes fabrication limits and capacitance and resistance problems of current trench capacitor designs.

SUMMARY OF THE INVENTION

A first aspect of the present invention is a structure, comprising: a substrate having a top surface defining a horizontal direction; a trench having contiguous upper, middle and lower regions, the middle region between the upper and lower regions, the trench extending from the top surface of the substrate into the substrate along an axis perpendicular to the top surface of the substrate, the axis defining a vertical direction; the upper region of the trench adjacent to the top surface of the substrate having a vertical sidewall profile and a first width in the horizontal direction; and the middle region of the trench having a tapered sidewall profile, a width in the horizontal direction of the middle region at a juncture of the upper region and the middle region being the first width and being greater than a second width in the horizontal direction of the middle region at a juncture of the middle region and the lower region.

A second aspect of the present invention is a method forming a trench in a substrate having a top surface defining a horizontal direction, comprising: forming a masking layer on the top surface of the substrate; forming an opening in the masking layer to define a perimeter of a trench; and forming the trench in the substrate through the opening, the trench having contiguous upper, middle and lower regions, the middle region between the upper and lower regions, the trench extending from the top surface of the substrate into the substrate along an axis perpendicular to the top surface of the substrate, the axis defining a vertical direction, the upper region of the trench adjacent to the top surface of the substrate having a vertical sidewall profile and a first width in the horizontal direction, the middle region of the trench having a tapered sidewall profile, a width in the horizontal direction of the middle region at a juncture of the upper region and the middle region being the first width and being greater than a second width in the horizontal direction of the middle region at a juncture of the middle region and the lower region.

A third aspect of the present invention is a memory cell, comprising: a trench capacitor in a substrate, the trench capacitor having contiguous upper, middle and lower regions, the middle region between the upper and lower regions, the trench extending from a top surface of the substrate into the substrate along an axis perpendicular to the top surface of the substrate, the axis defining a vertical direction; the upper region of the trench adjacent to the top surface of the substrate having a vertical sidewall profile; the middle region of the trench having a tapered sidewall profile, a width in the horizontal direction of the middle region at a juncture of the upper region and the middle region being greater than a width in the horizontal direction of the middle region at a juncture of the middle region and the lower region; and a field effect transistor comprising a gate electrode separated from a channel region in the substrate by a gate dielectric layer on the top surface of the substrate and first and second source/drains formed in the substrate on opposite side of the channel region, the second source/drain electrically connected to an electrode formed in the trench.

A fourth aspect of the present invention is a method of fabricating a memory cell, comprising: forming a trench capacitor in a substrate, the trench capacitor having contiguous upper, middle and lower regions, the middle region between the upper and lower regions, the trench extending from a top surface of the substrate into the substrate along an axis perpendicular to the top surface of the substrate, the axis defining a vertical direction; the upper region of the trench adjacent to the top surface of the substrate having a vertical sidewall profile; the middle region of the trench having a tapered sidewall profile, a width in the horizontal direction of the middle region at a juncture of the upper region and the middle region being greater than a width in the horizontal direction of the middle region at a juncture of the middle region and the lower region; and forming a field effect transistor comprising a gate electrode separated from a channel region in the substrate by a gate dielectric layer on the top surface of the substrate and first and second source/drains formed in the substrate on opposite side of the channel region, the second source/drain electrically connected to an electrode formed in the trench.

BRIEF DESCRIPTION OF DRAWINGS

The features of the invention are set forth in the appended claims. The invention itself, however, will be best understood by reference to the following detailed description of an illustrative embodiment when read in conjunction with the accompanying drawings, wherein:

FIGS. 3A, 3B and 3C are cross-sectional views illustrating alternative lower region trench geometries of trench capacitors according to the embodiments of the present invention.

DETAILED DESCRIPTION OF THE INVENTION

Figure 1A:
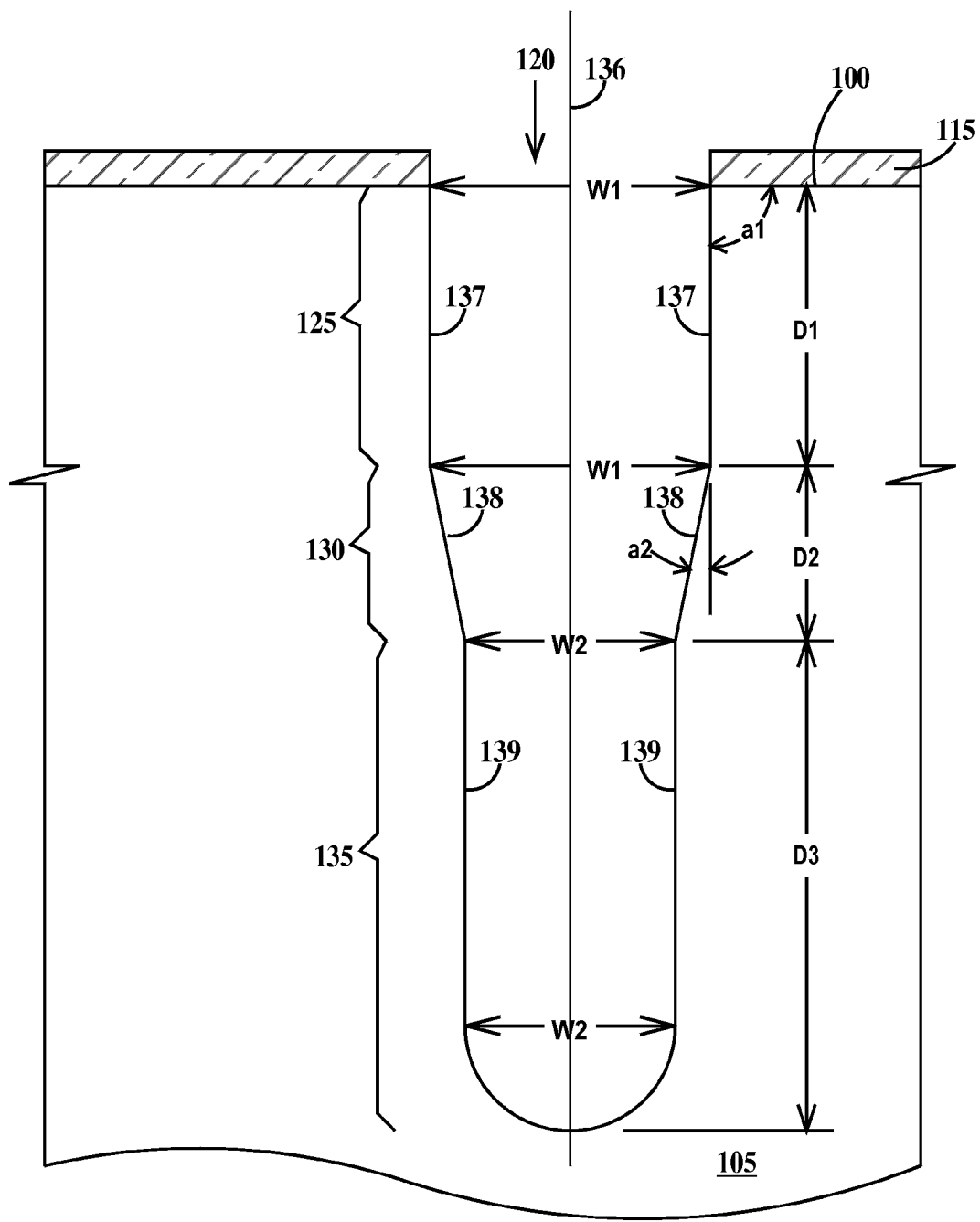
FIGS. 1A through 1H are cross-sectional drawings illustrating fabrication of trench capacitors according to the embodiments of the present invention.

FIGS. 1A through 1H are cross-sectional drawings illustrating fabrication of trench capacitors according to the embodiments of the present invention. In FIG. 1A, on a top surface 100 of a silicon substrate 105 a pad layer 115 is formed and a trench 120 is etched in the substrate through an opening formed in the pad layer. Pad layer 115, serves, among other uses, as a hardmask layer. Trench 120 has three distinct regions, an upper region 125 adjacent to top surface 100 of substrate 105, a middle region 130 and a lower region 135. In one example, pad layer 115 comprises a layer of silicon dioxide between about 2 nm and about 10 nm in thickness in contact with top surface 100 and a silicon nitride layer between about 100 nm and 2000 nm on the silicon dioxide layer. Additional one or more hardmask layers (not shown) can be formed on the pad layer 115 before the deep trench is etched. For example, a layer (not shown) comprising borosilicate glass (BSG) can be deposited on the pad layer 115 by chemical vapor deposition (CVD) and patterned along with the underlying pad layer 115. The additional hardmask layers facilitate the deep trench formation and can be removed after the deep trench 120 is etched.

Upper region 125 of trench 120 has a substantially uniform width W1 along an axis 136 perpendicular to top surface 100. Upper region 125 of trench 120 extends a distance D1 into substrate 105. Sidewall region 137 of upper region 125 of trench 120 is at an angle a1 relative to top surface 100 of substrate 105. Sidewall region 137 of upper region 125 of trench 120 is substantially perpendicular to top surface 100 of substrate 105. In one example, angle a1 is about 90°. In one example, angle a1 is between about 89.5° and about 90.5°. Sidewall region 137 is essentially a trench region having a vertical sidewall (relative to top surface 100).

Middle region 130 of trench 120 has width W1 where the middle region adjoins upper region 125 and a width W2 where it adjoins lower region 135. Middle region 130 extends a distance D2 into substrate 100 below upper region 125. W1 is greater than W2. Sidewall region 138 of middle region 135 is at an angle a2 relative to top surface 100 of substrate 105. Sidewall region 138 of middle region 130 of trench 120 tapers inward toward axis 122. In one example, angle a2 is about 1.0°. In one example, angle a2 is between about 3.0° and about 0.5°. In one example, the ratio (W1−W2)/W1 is less than about 0.2. In one example, W1-W2 is less than or equal to about 10 nm. In one example, W1 is equal to less than about 90 nm and W2 is equal to or less than about 80 nm. In one example, W1 is equal to less than about 65 nm and W2 is equal to or less than 55 nm. Sidewall region 138 is essentially a trench region having a tapered sidewall (relative to top surface 100). In one example D1 is between about four times and about five times D2.

Lower region 135 of trench 120 has width W2 where the lower region adjoins middle region 130 and a width W2 where it adjoins lower region 135. Lower region 135 of trench 120 has a substantially uniform width W2 along axis 136 and extends a distance D3 into substrate 105 below middle region 130. Sidewall region 139 of lower region 135 of trench 120 is essentially perpendicular to top surface 100 of substrate 100 in FIG. 1A. Sidewall region 139 is essentially a sidewall region having a vertical sidewall (relative to top surface 100). However, other geometries of lower region 135 are possible and are illustrated in FIGS. 3A, 3B and 3C and described infra.

Trench 120 may be formed by a reactive ion etch (RIE) process using a multiple step RIE process. Upper region 125 of trench 120 may be formed by a first RIE process step, middle region 130 of the trench may be formed by a second RIE process step different from the first RIE step process and lower region 135 of the trench may be formed by one or more additional RIE process steps. Table I illustrates exemplary first and second RIE process steps.

TABLE I

Exemplary RIE Process Steps for a Trench with W1 less than or equal to 90 nm (300 mm Wafer, about 20% Trench Area)

| Trench Region | Upper | Middle | Lower |
|---|---|---|---|
| RIE | Step 1 | Step 2 | Step 3 |
| Bias power (W) | 1300 | 1500 | 1800 |
| Pressure (mT) | 150 | 150 | 200 |
| $O_2$ (sccm) | 28 | 23 | 16 |
| $NF_3$ (sccm) | 36 | 36 | 32 |
| HBr (sccm) | 300 | 300 | 300 |
| Profile of Region | Vertical | Tapered | Vertical |
| Depth of Region (um) | 1.2 (D1) | 0.3 (D2) | 6.0 (D3) |

A person of ordinary skill in the art, will be able to modify the conditions given in Table I to fit other trench profiles and geometries without undue experimentation.

Figure 1B:
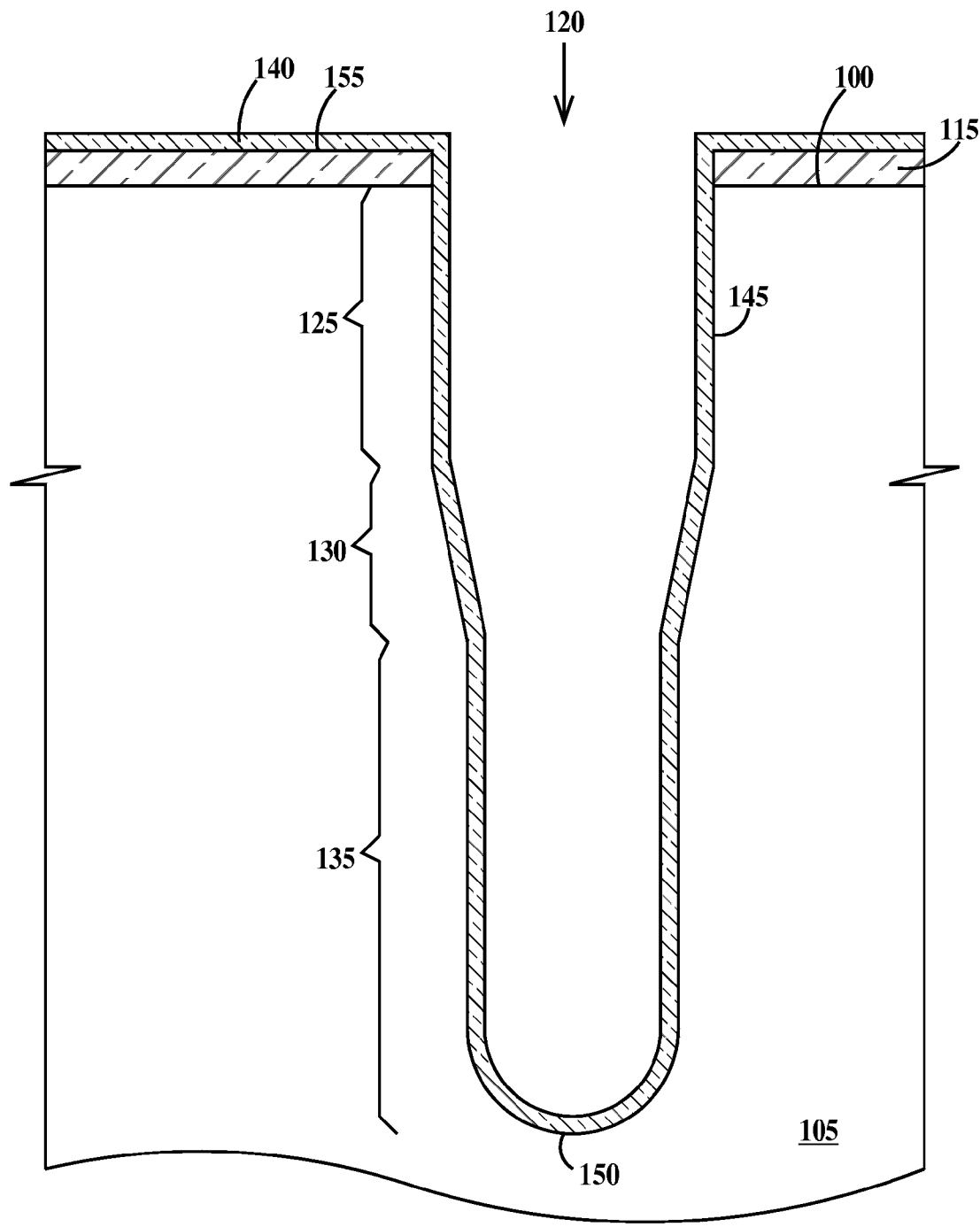

In FIG. 1B, a node dielectric layer 140 is formed on a sidewall 145 (includes sidewall regions 137, 138 and 139 illustrated in FIG. 1A and described supra) of trench 120, on a bottom 150 of the trench and on a top surface 155 of pad layer 115. In one example node dielectric is formed by low pressure chemical vapor deposition (LPCVD) of silicon nitride between about 2.5 nm and about 6.0 nm thick followed by an optional thermal oxidation. In one example, node dielectric comprises a high-k (dielectric constant) material between about 0.5 nm and about 6.0 nm thick formed by atomic layer deposition (ALD) or metalorganic chemical vapor deposition (MOCVD), examples of which include but are not limited metal oxides such as $Ta_2O_5$, $BaTiO_3$, $HfO_2$, $ZrO_2$, $Al_2O_3$, or metal silicates such as $HfSi_xO_y$ or $HfSi_xO_yN_z$ or combinations of layers thereof. A high-k dielectric material has a relative permittivity above about 10.

Figure 1C:
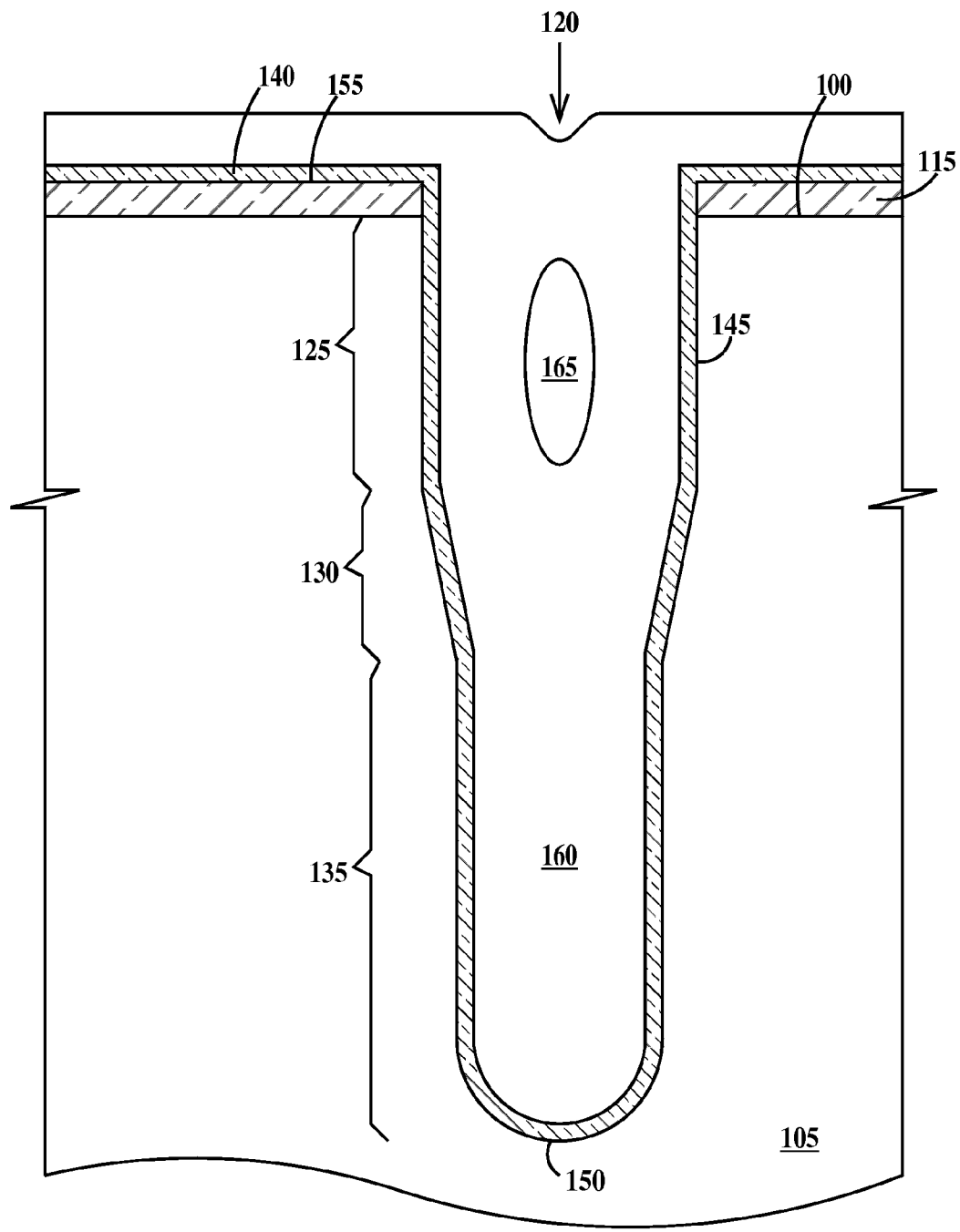

In FIG. 1C, trench 120 is filled with a first electrically conductive fill material 160. In one example, the first fill material 160 preferably comprises N-type doped polysilicon. Alternatively, first fill material 160 may comprise electrically conductive materials, including but not limited to, doped silicon germanium, tungsten, titanium, cobalt, copper, aluminum, other metals, tungsten silicide, titanium nitride, polysilicon and combinations thereof. In some cases, when first fill material 160 is polysilicon, a void 165 may form in the polysilicon in upper region 125 of trench 120.

Because the upper part of the trench is vertical for a significant distance before is tapers down, filling of the trench with polysilicon is more easily accomplished and any voids formed do not extend far enough into the tapered portion of the trench and can be removed or their disruption of fill interfaces drastically reduced during subsequent processing steps.

Figure 1D:
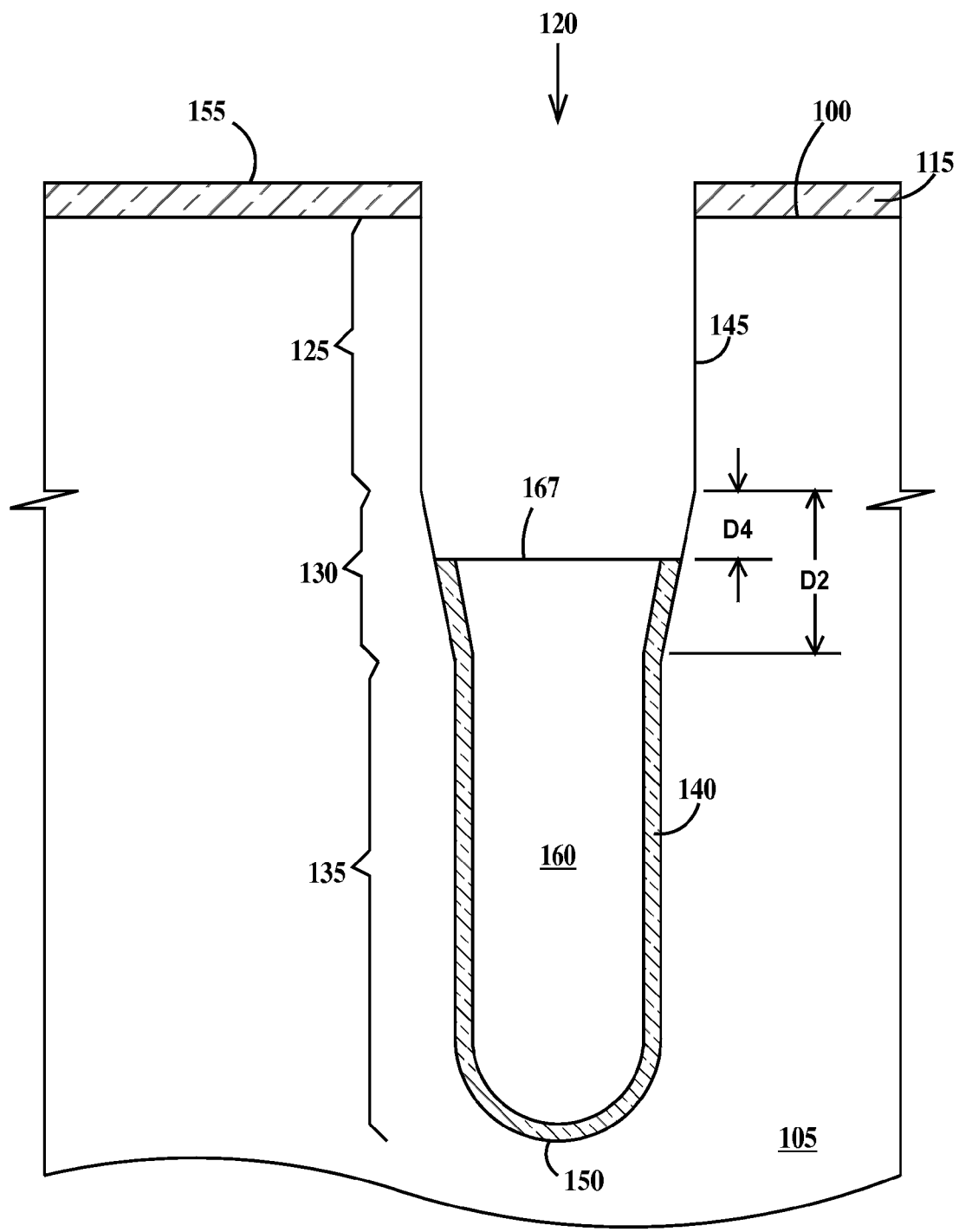

In FIG. 1D, a portion of first polysilicon 160 is removed from trench 120 so that a top surface 167 of first polysilicon 160 is within middle region 130 of trench 167. Top surface 167 is a distance D4 from the top of middle region 130. Node dielectric layer 140 is also removed from all surfaces (particularly sidewall 145 of trench 120) no longer protected by first polysilicon 160. In one example, first polysilicon 160 is removed by a recess RIE process. In one example, a chemical-mechanical-polish (CMP) is performed to coplanarize a top surface of first polysilicon 160 in trench 120 with atop surface 155 of pad layer 115 prior to a recess RIE process. In one example, node dielectric 140 (if not removed during the recess RIE) is removed by wet etching with an etchant of hydrofluoric acid mixed with ethylene glycol.

Figure 1E:
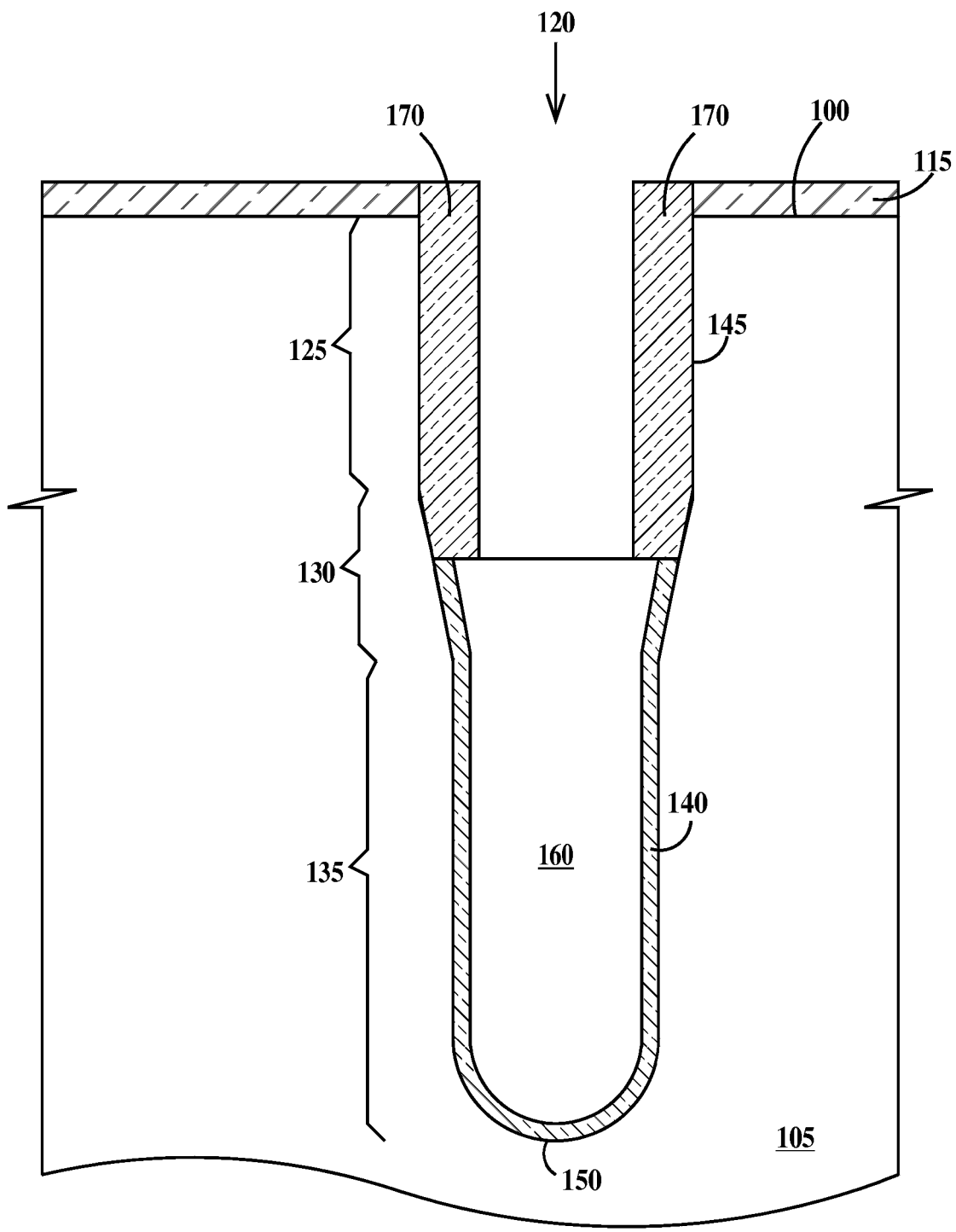

In FIG. 1E, a dielectric collar 170 is formed on sidewall 145 where sidewall 145 is not covered by node dielectric 140 and first polysilicon 160. In one example, collar 170 is formed by CVD deposition of a tetraethoxysilane (TEOS) oxide followed by an RIE process and is between about 15 nm and about 50 nm thick. In one example, a thermal oxidation process is performed to form a silicon dioxide (not shown) on the exposed sidewall 145 and on the top surface of the polysilicon 160 prior to the TEOS deposition. In one example, an annealing process at a temperature between 800° C. to 1200° C. is performed prior to the RIE process. In one example, collar 170 comprises a low-k (dielectric constant) material, examples of which include but are not limited to hydrogen silsesquioxane polymer (HSQ), methyl silsesquioxane polymer (MSQ), SiLK™ (polyphenylene oligomer) manufactured by Dow Chemical, Midland, Tex., Black Diamond™ (methyl doped silica or $SiO_x(CH_3)_y$ or $SiC_xO_yH_y$ or SiOCH) manufactured by Applied Materials, Santa Clara, Calif., organosilicate glass (SiCOH), and porous SiCOH between about 15 nm and about 40 nm thick. A low-k dielectric material has a relative permittivity of about 3.1 or less.

Because the upper part of the trench is vertical for a significant distance before is tapers down, formation of collars is easily accomplished and the collars may be kept relatively thick with no fear of reducing the cross-sectional area of the polysilicon fill which would increase the resistance of the capacitor.

Figure 1F:
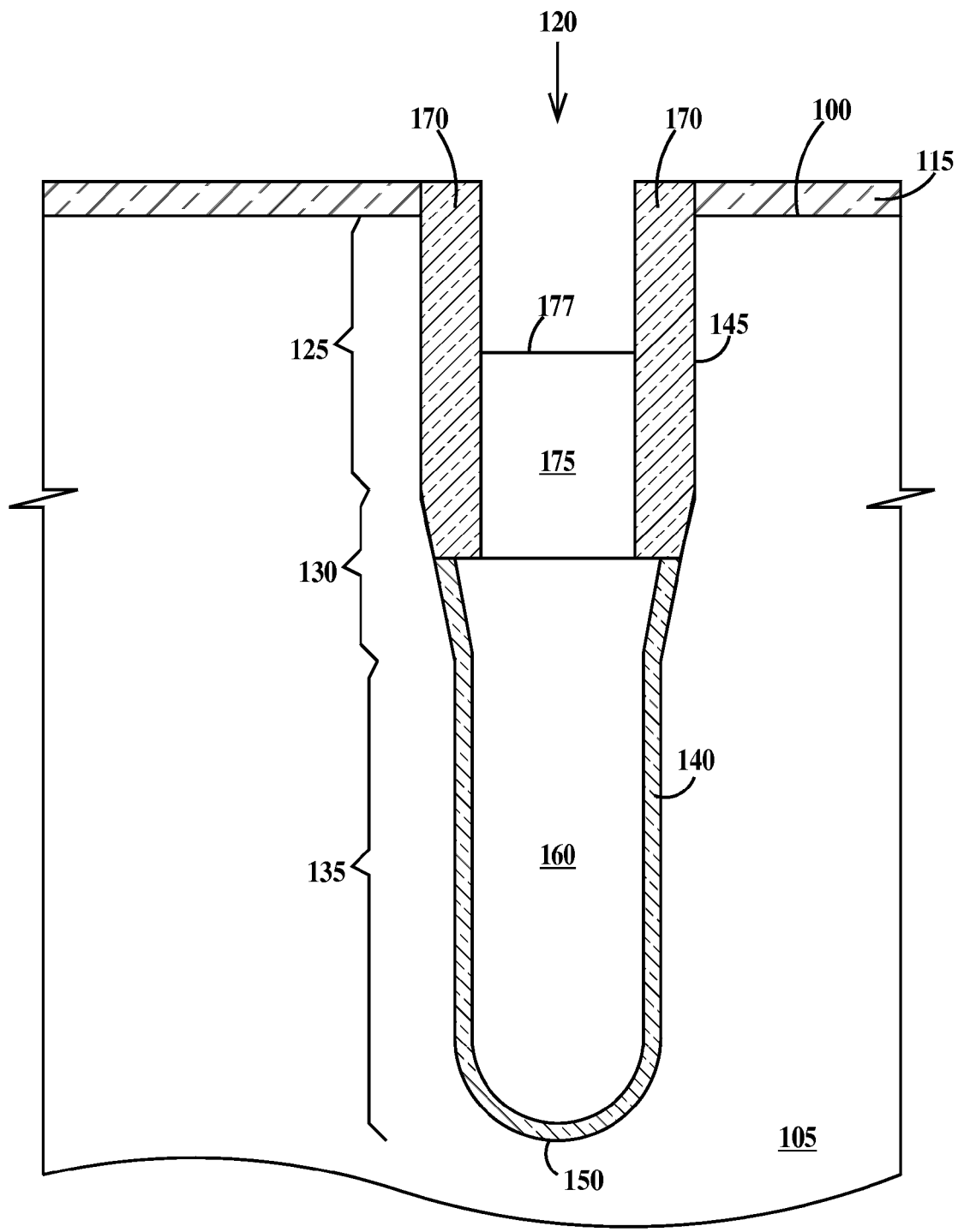

In FIG. 1F, trench 120 is filled with a second electrically conductive fill material 175 and then second fill material is recessed back so a top surface 177 of second fill material 175 is within upper region 125 of trench 120 in a manner similar to that described supra for recessing first fill material 160. In one example, second fill material 175 preferably comprises N-type doped polysilicon. Alternatively, second fill material 175 may comprise electrically conductive materials, including but not limited to, doped silicon germanium, tungsten, titanium, cobalt, copper, aluminum, other metals, tungsten silicide, titanium nitride, polysilicon and combinations thereof.

Figure 1G:
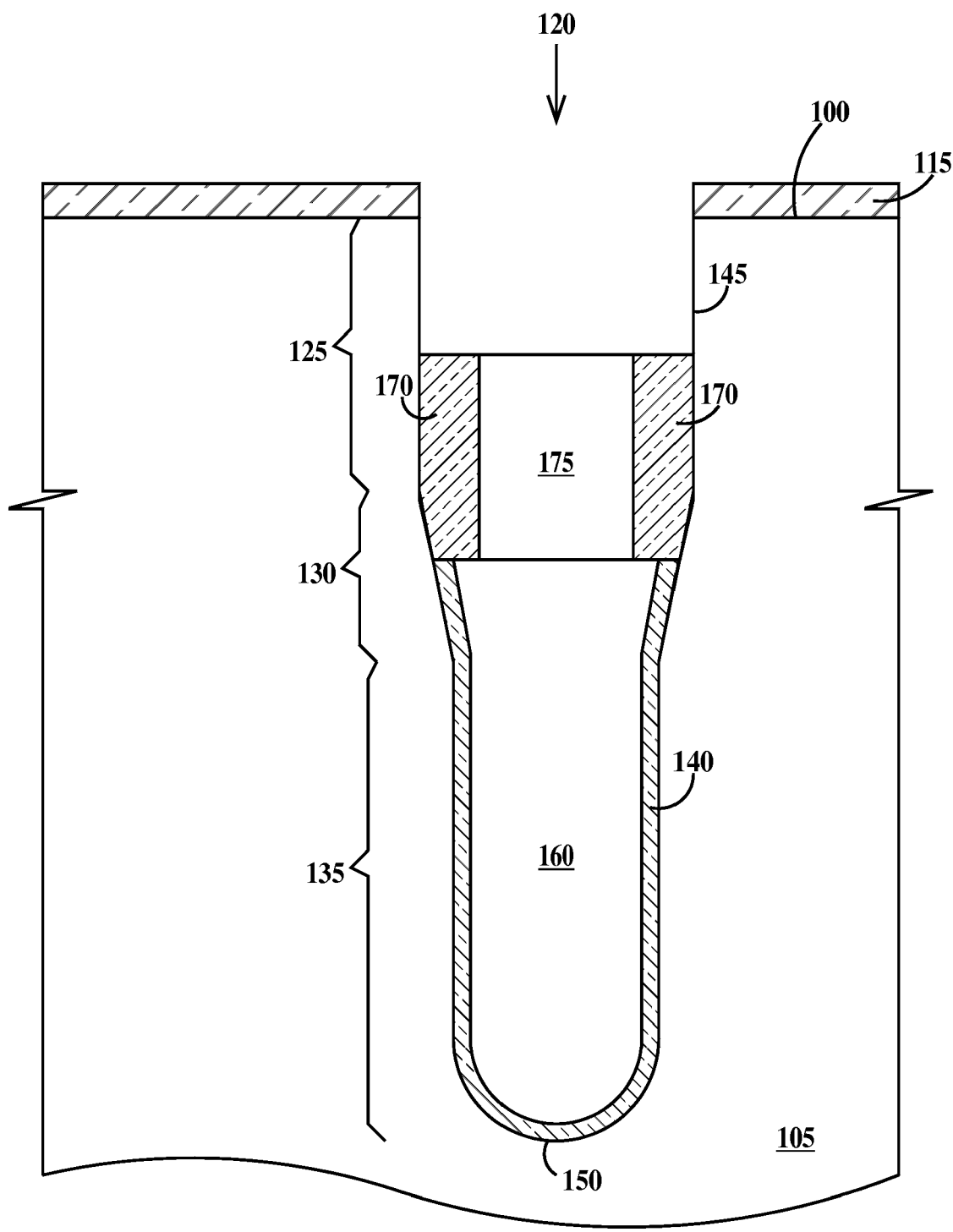

In FIG. 1G, collar 170 is removed from sidewall 145 where the collar is not protected by second polysilicon 175. Dry etch processing (such as plasma etching) or wet etch processing (such as etching in hydrofluoric acid containing etchants) may be used depending on the composition of collar 170.

Figure 1H:
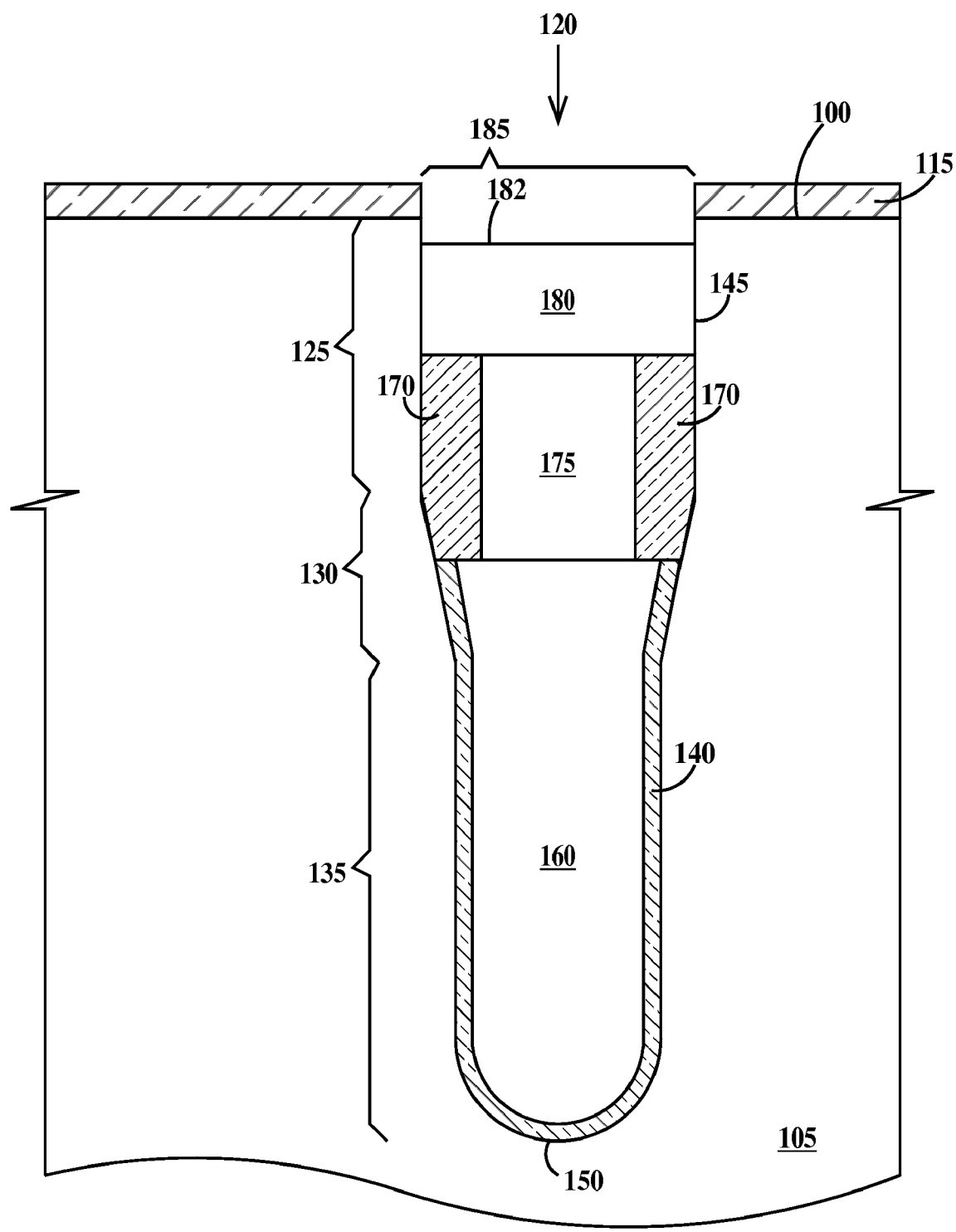

In FIG. 1H, trench 120 is filled with a third electrically conductive fill material 180 and then the third fill material recessed back so a top surface 182 of the second fill material is within upper region 125 of trench 120 but below top surface 100 of substrate 105 in a manner similar to that described supra for recessing first fill material 160. In one example, third fill material 180 preferably comprises N-type doped polysilicon. Alternatively, third fill material 180 may comprise electrically conductive materials, including but not limited to, doped silicon germanium, tungsten, titanium, cobalt, copper, aluminum, other metals, tungsten silicide, titanium nitride, polysilicon and combinations thereof.

Fabrication of a trench capacitor 185 according to the embodiments of the present invention is essentially complete. Additional steps, described infra, may be performed to fabricate a dynamic access memory (DRAM) cell.

Figure 2:
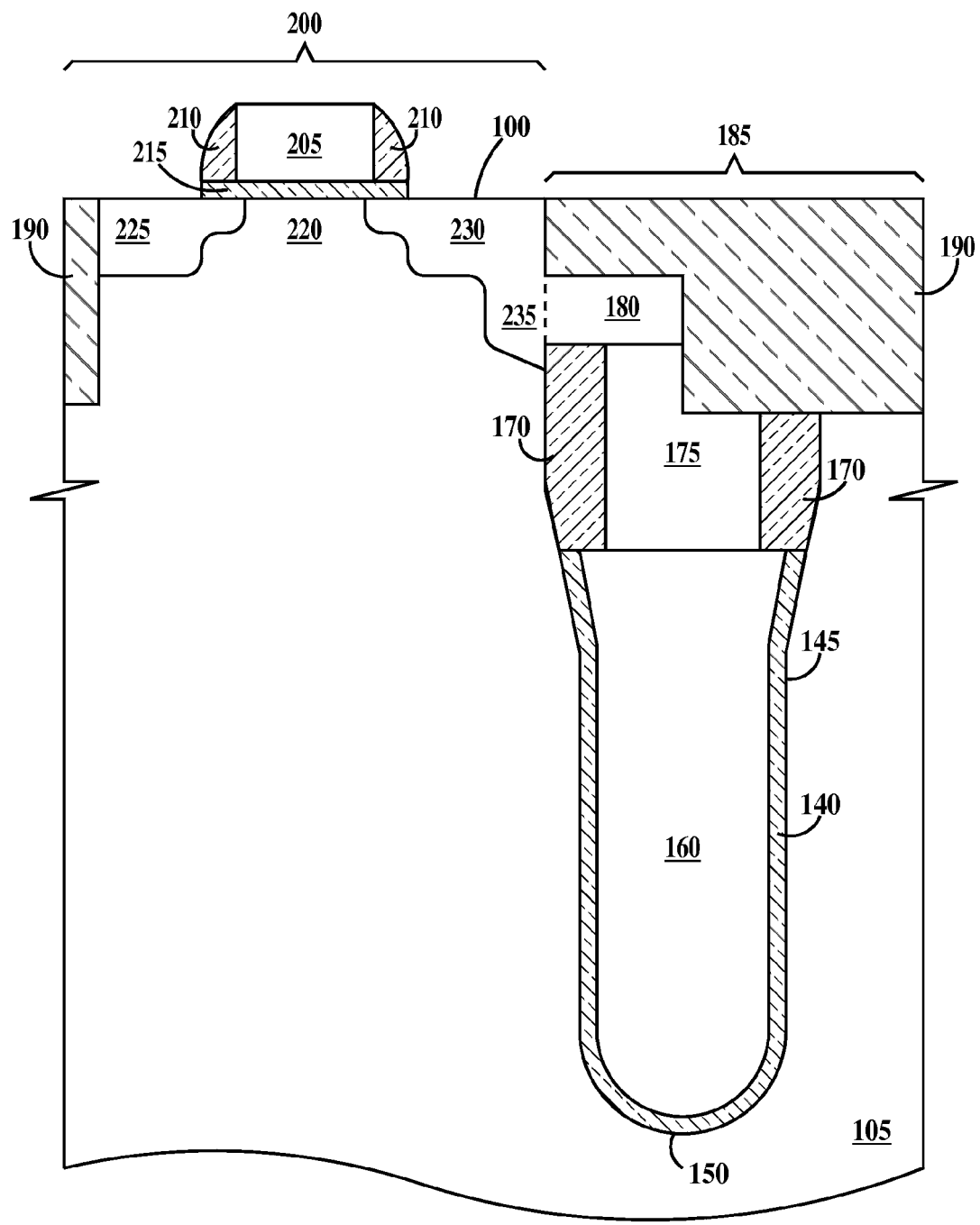
FIG. 2 is a cross-sectional view of a memory cell using trench capacitors according to the embodiments of the present invention.

FIG. 2 a cross-sectional view of a memory cell using trench capacitors according to the embodiments of the present invention. In FIG. 2, a trench isolation 190 is formed in substrate 105 and partially into trench capacitor 185. In one example, trench isolation 190 may be formed by (1) etching trenches into substrate 105 and into a portion of trench capacitor 185, using pad layer 115 (see FIG. 1H) as a hardmask, (2) over-filling the trench with a dielectric material, such as TEOS oxide and (3) performing a CMP down to the pad layer.

Next, pad layer 115 (see FIG. 1H) is removed and a field effect transistor (FET) 200 is formed adjacent to and physically and electrically connected to trench capacitor 185. Formation of FETs is well known in the art. FET 200 includes a gate electrode 205 and dielectric spacers 210 formed over a gate dielectric 215 formed over a channel region 220 separating a first source/drain 225 from a second source/drain 230. A buried strap 235 (formed by out-diffusion of dopants from third polysilicon 180 provides an electrical connection between second source/drain 230 and third polysilicon 180. In one example. FET 200 is an n-channel FET (NFET).

FIGS. 3A, 3B and 3C are cross-sectional views illustrating alternative lower region trench geometries of trench capacitors according to the embodiments of the present invention. Any of the trenches 120A, 120B or 120C of respective FIGS. 3A, 3B and 3C may replace trench 120 of FIG. 1A as the starting trench for the fabrication of a trench capacitor according to the embodiments of the present invention.

In FIG. 3A, upper and middle regions 125 and 130 of trench 120A are the same as upper and middle regions 125 and 130 of trench 120 of FIG. 1A. A lower region 135A of trench 120A has an inward tapering sidewall region 139A so a width W3 at the bottom of the lower region is less than the width W2 at the top of the lower region.

In FIG. 3B, upper and middle regions 125 and 130 of trench 120B are the same as upper and middle regions 125 and 130 of trench 120 of FIG. 1A. A lower region 135B of trench 120B has an outward tapering sidewall region 139B so a width W4 at the bottom of the lower region is greater than the width W2 at the top of the lower region.

In FIG. 3C, upper and middle regions 125 and 130 of trench 120C are the same as upper and middle regions 125 and 130 of trench 120 of FIG. 1A. A lower region 135C of trench 120C includes a vertical region 240 and a bulbous region 245 (the vertical region is between middle region 130 and bulbous region 245). Vertical region 240 has a width W2 and bulbous region 245 has a maximum width W5, where W5 is greater than W2. Trenches 120B and 120C are known as a "bottle" trenches and when used for a trench capacitor results in a "bottle trench capacitor."

Thus the present invention provides trench capacitor structures and a method of fabricating trench capacitors that is scalable to ever decreasing trench widths and that overcomes fabrication limits and capacitance and resistance problems of current trench capacitor designs.

The description of the embodiments of the present invention is given above for the understanding of the present invention. It will be understood that the invention is not limited to the particular embodiments described herein, but is capable of various modifications, rearrangements and substitutions as will now become apparent to those skilled in the art without departing from the scope of the invention. Therefore, it is intended that the following claims cover all such modifications and changes as fall within the true spirit and scope of the invention.

What is claimed is:
1. A structure, comprising:
a substrate having a top surface defining a horizontal direction;
a trench having contiguous upper, middle and lower regions, said middle region between said upper and lower regions, said lower region closed by a bottom of said trench, said trench extending from said top surface of said substrate into said substrate along an axis perpendicular to said top surface of said substrate, said axis defining a vertical direction;

said upper region of said trench having a vertical sidewall profile and a first width in said horizontal direction;

said middle region of said trench having a tapered sidewall profile, a width in said horizontal direction of said middle region at a juncture of said upper region and said middle region being said first width and being greater than a second width in said horizontal direction of said middle region at a juncture of said middle region and said lower region;

a first dielectric liner on the bottom of said trench and on sidewalls of said trench in said lower region and on sidewalls of said trench in a lower region of said middle region, said lower region of said middle region abutting said lower region;

a second dielectric liner on sidewalls of said trench in an upper region of said middle region and on lower regions of said upper region, said second dielectric liner thicker than said first dielectric liner, said upper region of said middle region abutting said lower region of said upper region;

a first electrically conductive material filling remaining space in said lower region and said lower region of said middle region;

a second electrically conductive material in said upper region of said middle region and said lower region of said upper region; and a third electrically conductive material in an upper region of said upper region, said upper region of said upper region abutting said lower region of said upper region.

2. The structure of claim 1, wherein said upper region has a uniform width in said horizontal direction from said top surface of said substrate to said middle region.

3. The structure of claim 1, wherein designating said first width as W1 and said second width as W2, the ratio of (W1−W2)/W1 is less than or equal to 0.2.

4. The structure of claim 1, further including:
said lower region of said trench having a vertical sidewall profile.

5. The structure of claim 1, further including:
said lower region of said trench having a tapered sidewall profile, a width in said horizontal direction of said lower region at a juncture of said lower region and said middle region being said second width and being greater than a third width in said horizontal direction of said lower region at a bottom of said trench.

6. The structure of claim 1, further including:
said lower region of said trench having a tapered sidewall profile, a width in said horizontal direction of said lower region at a juncture of said lower region and said middle region being said second width and being less than a third width in said horizontal direction of said lower region at a bottom of said trench.

7. The structure of claim 1, further including:
said lower region having a vertical region abutting said middle region and a bulbous bottom region abutting said vertical region, said vertical region having vertical sidewall profile and said second width in said horizontal direction, said bulbous region having a maximum width in said horizontal direction that is greater than said second width.

8. The structure of claim 1, wherein said first, second and third electrically conductive materials are independently selected from the group consisting of doped silicon germanium, tungsten, titanium, cobalt, copper, aluminum, metals, tungsten silicide, titanium nitride, polysilicon and doped polysilicon.

9. A memory cell, comprising:
a trench capacitor in a substrate, said trench capacitor having contiguous upper, middle and lower regions, said middle region between said upper and lower regions, said lower region closed by a bottom of said trench, said trench extending from a top surface of said substrate into said substrate along an axis perpendicular to said top surface of said substrate, said axis defining a vertical direction;

said upper region of said trench having a vertical sidewall profile;

said middle region of said trench having a tapered sidewall profile, a width in said horizontal direction of said middle region at a juncture of said upper region and said middle region being greater than a width in said horizontal direction of said middle region at a juncture of said middle region and said lower region;

a node dielectric layer on a bottom of said trench and on sidewalls of said trench in said lower region and on sidewalls of said trench in a lower region of said middle region, said lower region of said middle region abutting said lower region;

a dielectric collar on sidewalls of said trench in an upper region of said middle region and on lower regions of said upper region, said dielectric collar thicker than said node dielectric layer, said upper region of said middle region abutting said lower region of said upper region;

a first electrically conductive material filling remaining space in said lower region and said lower region of said middle region;

a second electrically conductive material in said upper region of said middle region and said lower region of said upper region;

a third electrically conductive material in an upper region of said upper region, said upper region of said upper region abutting said lower region of said upper region; and a field effect transistor comprising a gate electrode separated from a channel region in said substrate by a gate dielectric layer on said top surface of said substrate and first and second source/drains formed in said substrate on opposite side of said channel region, said second source/drain electrically connected to said third electrically conductive material.

10. The memory cell of claim 9, wherein said second source/drain is electrically connected to an electrode by a buried strap comprised of said third electrically conductive material, said buried strap extending from said electrode through a notch in said dielectric collar in said upper region of said trench to said second source/drain.

11. The memory cell of claim 9, wherein said first, second and third electrically conductive material independently comprises a material selected from the group consisting of doped silicon germanium, tungsten, titanium, cobalt, copper, aluminum, other metals, tungsten silicide, titanium nitride, polysilicon, doped polysilicon and combinations thereof.

12. The memory cell of claim 9, further including:
said lower region of said trench having a vertical sidewall profile.

13. The memory cell of claim 9, further including:
said lower region of said trench having a tapered sidewall profile, a width in said horizontal direction of said lower region at a juncture of said lower region and said middle region being greater than a width in said horizontal direction of said lower region at a bottom of said trench.

14. The memory cell of claim 9, further including:
said lower region of said trench having a tapered sidewall profile, said width in said horizontal direction of said lower region at said juncture of said lower region and said middle region being less than said width in said horizontal direction of said lower region at said bottom of said trench.

15. The memory cell of claim 9, further including:
said lower region having a vertical region having a vertical sidewall profile and abutting said middle region and a bulbous bottom region abutting said vertical region, said bulbous region having a maximum width in said horizontal direction that is greater than a width in said horizontal direction of said vertical region.

16. The structure of claim 1, wherein said third electrically conductive material is only in said upper region of said upper region of said trench.

17. The structure of claim 1, wherein said second dielectric is on said sidewalls of said trench only in said upper region of said middle region of said trench and said lower region of said upper region of said trench.

18. The memory cell of claim 9, wherein designating said width of said upper region as W1 and said width of at the juncture of said middle region and said lower region as W2, the ratio of (W1−W2)/W1 is less than or equal to 0.2.

19. The memory cell of claim 9, wherein said third electrically conductive material is only in said upper region of said upper region of said trench.

20. The memory cell of claim 9, wherein said dielectric collar is on said sidewalls of said trench only in said upper region of said middle region of said trench and said lower region of said upper region of said trench.

* * * * *